(12) United States Patent
Li

(10) Patent No.: US 9,799,855 B2
(45) Date of Patent: Oct. 24, 2017

(54) DOUBLE-SIDE ORGANIC LIGHT EMITTING DIODE WITH COMPOSITE ANODE AND CATHODE INCLUDING TRANSPARENT METAL LAYERS

(71) Applicant: Shenzhen China Star Optoelectronics Technology Co., Ltd., Shenzhen, Guangdong (CN)

(72) Inventor: Jinchuan Li, Guangdon (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 473 days.

(21) Appl. No.: 14/530,825

(22) Filed: Nov. 2, 2014

(65) Prior Publication Data
US 2015/0050764 A1 Feb. 19, 2015

Related U.S. Application Data

(62) Division of application No. 13/824,382, filed on Mar. 17, 2013, now Pat. No. 8,907,355.

(51) Int. Cl.
*H01L 51/56* (2006.01)
*H01L 51/52* (2006.01)
*H01L 51/00* (2006.01)

(52) U.S. Cl.
CPC .......... *H01L 51/56* (2013.01); *H01L 51/0021* (2013.01); *H01L 51/5203* (2013.01); *H01L 51/5215* (2013.01); *H01L 51/5228* (2013.01); *H01L 51/5234* (2013.01); *H01L 51/5253* (2013.01); *H01L 51/5262* (2013.01); *H01L 51/5281* (2013.01); *H01L 2251/5323* (2013.01)

(58) Field of Classification Search
CPC ......... H01L 2251/5323; H01L 51/5215; H01L 51/5234; H01L 51/56
USPC .......................................................... 438/29
See application file for complete search history.

(56) References Cited

U.S. PATENT DOCUMENTS

2008/0315763 A1* 12/2008 Dobbertin ........... H01L 51/5088
313/512

FOREIGN PATENT DOCUMENTS

| CN | 1841813 A | 10/2006 | |
|---|---|---|---|
| CN | 101438199 A | 5/2009 | |
| CN | 202035172 U | 11/2011 | |
| FR | WO 2012143648 A1 * | 10/2012 | ............. G02B 1/116 |

* cited by examiner

*Primary Examiner* — Marcos D Pizarro
(74) *Attorney, Agent, or Firm* — Andrew C. Cheng

(57) ABSTRACT

The present invention discloses a diode and a manufacturing method thereof and a display apparatus. The diode comprises a composite anode, a transparent metal oxide layer, a basic stack layer, and a composite cathode. The composite anode comprises a transparent anode layer and a first transparent metal layer. The first transparent metal layer is formed on the transparent anode layer. The transparent metal oxide layer is formed on the first transparent metal layer. The basic stack layer is formed on the transparent metal oxide layer. The composite cathode comprises two second transparent metal layers. The two second transparent metal layers are formed on the basic stack layer. Both transmittance and efficiency of the diode are significantly improved. The reliability of the diode is improved to elongate the lifetime of the diode.

3 Claims, 3 Drawing Sheets

DOUBLE-SIDE ORGANIC LIGHT EMITTING DIODE WITH COMPOSITE ANODE AND CATHODE INCLUDING TRANSPARENT METAL LAYERS

CROSS REFERENCE

This is a divisional application of prior co-pending application 13/824,382, submitted on Dec. 11, 2012, entitled "Light Emitting Diode and Manufacturing Method Thereof and Display Apparatus", which is a national stage application of PCT/CN13/72488 submitted on Dec. 3, 2013, and which is based on and claims priority of Chinese Patent Application No. 201310073585.5 filed on Jul. 3, 2013, the entire contents of which are hereby incorporated by reference.

BACKGROUND OF THE INVENTIONh

1. Field of the Invention

The present invention relates to a light emitting diode and a manufacturing method thereof and a display apparatus.

2. Description of the Related Art

A conventional double-emitting organic light emitting diode is usually fabricated by sequentially forming a single-layered transparent anode, an organic layer (comprises a hole inject layer, a hole transport layer, a light emitting layer, an electron transport layer, and an electron inject layer), a transparent metal cathode, and a passivation layer on a glass substrate.

In order to achieve a better transmittance, the cathode of such a double-emitting diode is made very thin. Hence, the cathode resistance tends to be too high and the contact between the cathode and the periphery circuit of the diode is poor. As a result, the performance and reliability of the diode are bad. The lifetime is short and the transmittance of such a diode is only around 50%.

SUMMARY OF THE INVENTION

It is an objective of the present invention to provide a diode and a manufacturing method thereof and a display apparatus to significantly improve transmittance and efficiency of the diode, and to improve the reliability of the diode and elongate the lifetime of the diode.

In order to resolve the above-mentioned problem, the present invention provides a diode. The diode comprises a composite anode, a transparent metal oxide layer, a basic stack layer, and a composite cathode. The composite anode comprises a transparent anode layer and a first transparent metal layer. The first transparent metal layer is formed on the transparent anode layer. The transparent metal oxide layer is formed on the first transparent metal layer. The basic stack layer is formed on the transparent metal oxide layer. The composite cathode comprises two second transparent metal layers. The two second transparent metal layers are formed on the basic stack layer.

In one aspect of the present invention, the diode further comprises an anti-reflective layer, and the anti-reflective layer is formed on the non-transparent metal layer.

In another aspect of the present invention, the diode further comprises a barrier layer formed on the anti-reflective layer, and the anti-reflective layer is a film used for blocking moisture and oxygen.

In another aspect of the present invention, the first transparent metal layer comprises a gold layer or a silver layer having a thickness between 5 nm and 10 nm.

In another aspect of the present invention, a thickness of the transparent metal oxide layer is between 1 nm and 5 nm, and a difference between a work function of a material making the transparent metal oxide layer and a highest occupied molecular orbital value of a material used for making the electron inject layer of the diode is between 0 eV and 1 eV.

In another aspect of the present invention, the difference between the work function of the material making the transparent metal oxide layer and the highest occupied molecular orbital value of the material used for making the electron inject layer of the diode is 0 eV.

In another aspect of the present invention, each of the two second transparent metal layers comprises a magnesium layer or a magnesium:silver layer having a thickness between 5 nm and 15 nm, and the non-transparent metal layer is an aluminum layer having a thickness between 50 nm and 250 nm.

In another aspect of the present invention, the barrier layer comprises a third transparent metal layer and two thin films, and the third transparent metal layer is formed between the two thin films.

In another aspect of the present invention, the two thin films are made of 8-hydroxyquionline lithium and have a thickness between 10 nm and 60 nm, and the third transparent metal layer is an aluminum layer having a thickness between 1 nm and 10 nm.

In still another aspect of the present invention, a material used for making the anti-reflective layer is the same as a material used for making the hole transport layer or the electron transport layer of the diode.

In yet another aspect of the present invention, the anti-reflective layer is made of n-Propyl bromide and has a thickness between 10 nm and 80 nm.

In order to resolve the above-mentioned problem, the present invention also provides a display apparatus comprising a diode and a cover plate. The diode comprises a composite anode, a transparent metal oxide layer, a basic stack layer, and a composite cathode. The composite anode comprises a transparent anode layer and a first transparent metal layer. The first transparent metal layer is formed on the transparent anode layer. The transparent metal oxide layer is formed on the first transparent metal layer. The basic stack layer is formed on the transparent metal oxide layer. The composite cathode comprises two second transparent metal layers. The two second transparent metal layers are formed on the basic stack layer.

In one aspect of the present invention, the diode further comprises an anti-reflective layer, and the anti-reflective layer is formed on the non-transparent metal layer.

In another aspect of the present invention, the diode further comprises a barrier layer formed on the anti-reflective layer, and the anti-reflective layer is a film used for blocking moisture and oxygen.

In order to solve the above-mentioned problem, the present invention further provides a method for manufacturing a diode. The method comprises the following steps: evaporating a transparent anode layer on a glass substrate, evaporating a first transparent metal layer on the transparent anode layer, and the transparent anode layer and the first transparent metal layer constituting a composite anode; evaporating a transparent metal oxide layer on the first transparent metal layer; evaporating a basic stack layer on the transparent metal oxide layer; and evaporating two second transparent metal layers on the basic stack layer sequentially.

In one aspect of the present invention, the method further comprises the step after evaporating the two second transparent metal layers on the basic stack layer sequentially: evaporating a non-transparent metal layer on at least one edge of the second transparent metal layer, and an area of the non-transparent metal layer being smaller than one fifth of an area of the second transparent metal layer.

In another aspect of the present invention, the method further comprises the step after evaporating the non-transparent metal layer on the at least one edge of the second transparent metal layer: evaporating an anti-reflective layer on the non-transparent metal layer.

In still another aspect of the present invention, the method further comprises the step after evaporating the anti-reflective layer on the non-transparent metal layer: forming a barrier layer to cover the anti-reflective layer, and the barrier layer being a film used for blocking moisture and oxygen.

In contrast to the prior art, the composite structure adopted by the present invention diode, which is the combination of the composite anode, the transparent metal oxide layer, and the composite cathode, will render a better energy level match among all structural layers in the diode. In addition, with the help of mirror effect and microcavity effect, both efficiency and brightness of the diode from the substrate surface are much more improved. The luminous performance and reliability of the diode are thus improved to elongate the lifetime of the diode.

DESCRIPTION OF THE EMBODIMENTS

Figure 1:
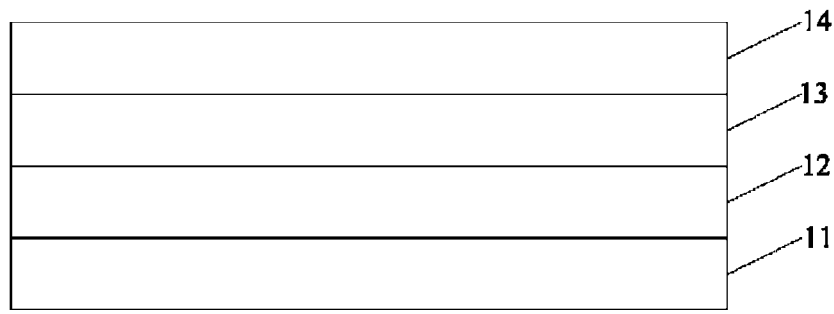
FIG. 1 is a schematic diagram showing a structure of a diode according to an embodiment of the present invention.
Figure 2:
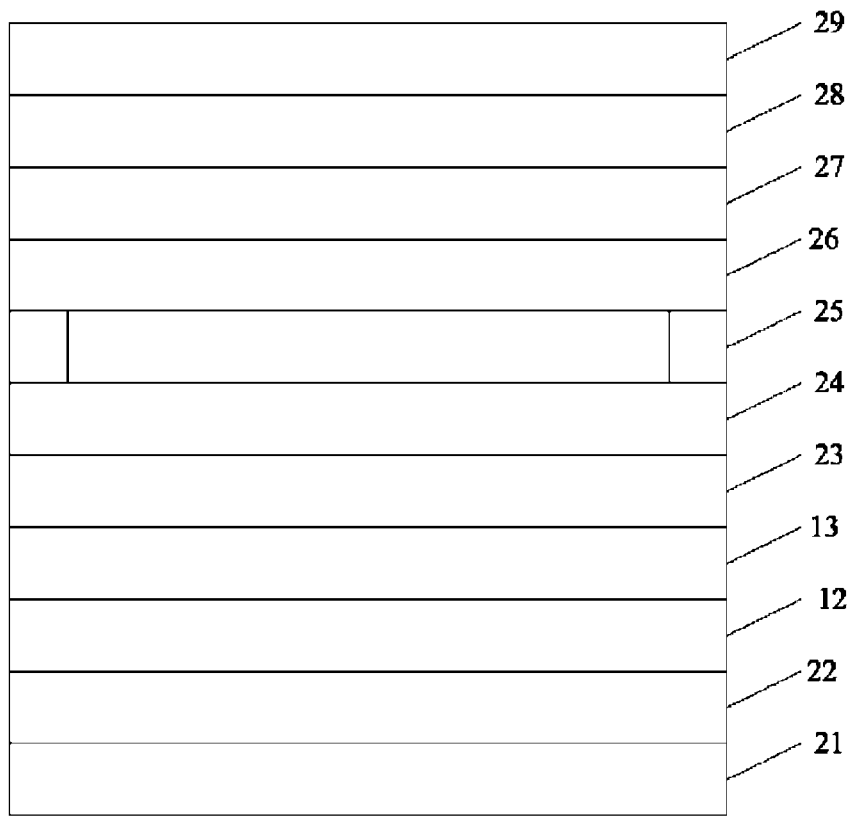
FIG. 2 is a schematic diagram showing a structure of a diode according to another embodiment of the present invention.

Please refer to FIG. 1, a diode according to an embodiment of the present invention comprises a composite anode 11, a transparent metal oxide layer 12, a basic stack layer 13, and a composite cathode 14. In order to further illustrate the structure of the present invention diode, please also refer to FIG. 2.

The composite anode 11 comprises a transparent anode layer 21 and a first transparent metal layer 22. The first transparent metal layer 22 is formed on the transparent anode layer 21. The first transparent metal layer 22, being a high purity metal layer, is very thin. Its thickness is kept to such an extent that the transparent effect can be realized, and the light transmittance must be more than 90 percent. The first transparent metal layer 22 can be formed, for example, by evaporating a gold (Au) layer or a silver (Ag) layer having a thickness of 5-10 nm and a purity of more than 99.999 percent on the conventional transparent anode layer 21. For example, the silver layer having a thickness of 10 nm can be used as the first transparent metal layer 22.

The transparent metal oxide layer 12 is formed on the first transparent metal layer 22. A thickness of the transparent metal oxide layer 12 is preferably kept between 1 nm and 5 nm. A material with a work function close to a highest occupied molecular orbital (HOMO) value of a material used for making the hole inject layer of the diode (difference is 0-1 eV) may be selected to make the transparent metal oxide layer 12 so that diode voltage is reduced. Preferably, a material with a work function equal to the HOMO value of the material used for making the hole inject layer of the diode is selected to make the transparent metal oxide layer 12. For example, tungsten trioxide ($WO_3$) can be selected to make the transparent metal oxide layer 12.

The basic stack layer 13 is formed on the transparent metal oxide layer 12. The basic stack layer 13 is a major portion of the diode, and usually comprises a hole inject layer, a hole transport layer, a light emitting layer, an electron transport layer, and an electron inject layer. The hole inject layer, the hole transport layer, the light emitting layer, the electron transport layer, and the electron inject layer are sequentially formed on the transparent metal oxide layer 12.

The composite cathode 14 comprises two second transparent metal layers, which are a second transparent metal layer I 23 and a second transparent metal layer II 24. The second transparent metal layer I 23 and the second transparent metal layer II 24 are formed on the basic stack layer 13 in sequence, namely, formed immediately on the electron inject layer.

To further improve the illumination effect of the diode, the composite cathode 14 further comprises a non-transparent metal layer 25. The non-transparent metal layer 25 is formed on at least one edge of the second transparent metal layer II 24, and an area of the non-transparent metal layer 25 is smaller than one fifth of a total area of the second transparent metal layer II 24. Usually, the second transparent metal layer I 23 is first evaporated on the whole emitting area followed by forming the second transparent metal layer II 24 on the second transparent metal layer I 23 by evaporation. Each of the second transparent metal layer I 23 and the second transparent metal layer II 24 may be a magnesium (Mg): silver (Ag) layer or a Ag layer having a thickness between 5 nm and 15 nm to ensure better transmittance. After that, the thicker non-transparent metal layer 25 is evaporated on any edge or edges of the second transparent metal layer II 24. A thickness of the non-transparent metal layer 25 is greater than 50 nm. For example, an aluminum (Al) layer has a thickness between 50 nm and 250 nm. More preferably the thickness ranges from 60 nm to 90 nm and most preferably 80 nm. The non-transparent metal layer 25 is non-transmissive and other portions of the cathode are transparent to ensure the double-emitting effect of the present invention diode.

With the combination of the composite anode, the transparent metal oxide layer, and the composite cathode, the diode will have a better energy level match. In addition to that, with the help of mirror effect and microcavity effect, both efficiency and brightness of the diode are much more improved when compared with the conventional diode.

Moreover, the present invention diode further comprises an anti-reflective layer 26. The anti-reflective layer 26, being an external-coupling light emitting layer, is formed on the non-transparent metal layer 25 to further improve the luminous performance of the diode. The anti-reflective layer 26 may be made of a low-cost organic material, such as a material used for making the hole transport layer or the electron transport layer of the diode. However, the selected material should not have a high absorption of visible light, and the material must be stable enough to avoid crystallization phenomenon after the film is formed. For example, n-Propyl bromide (NPB) can be selected to make the anti-reflective layer 26. A thickness of the anti-reflective layer 26 is preferably kept between 10 nm and 80 nm. More preferably the thickness ranges from 50 nm to 70 nm and most preferably 60 nm.

In the ordinary course of manufacturing of a display apparatus, a desiccant is first applied to the non-emitting area of the diode and followed by sealing with an UV adhesive. Under the circumstances, the non-emitting area of the diode is enlarged so that the bezel width of the display apparatus is large to cause unaesthetic appearance of the display apparatus.

In order to make the display apparatus having the packaged diode more aesthetically, the present invention diode further comprises a barrier layer. The barrier layer is a film used for blocking moisture and oxygen. The barrier layer, being used for replacing the conventional desiccant layer, may be any thin film being able to block moisture and oxygen. A stack of a plurality of thin films may be used as the barrier layer to achieve a better barrier effect. More preferably, a sandwich structure constituted by two thin films, namely a thin film I 27 and a thin film II 29, together with a third transparent metal layer 28 is used as the barrier layer (in the figure structural layers indicated by reference numbers 27, 28, 29 constitute the barrier layer).

A thin film material used for making the barrier layer may be a low-cost organic or inorganic material, for example: 8-hydroxyquionline lithium (Liq). A material of the thin film I 27 may be different from a material of the thin film II 29, or the material of the thin film I 27 may be the same as the material of the thin film II 29. Thicknesses of the thin film I 27 and the thin film II 29 are preferably kept between 10 nm and 60 nm. More preferably, the thicknesses range from 20 nm to 50 nm and most preferably 40 nm.

The third transparent metal layer 28 may be made of a low-cost metal, for example: aluminum or copper. A thickness of the third transparent metal layer 28 is preferably kept between 1 nm and 10 nm. More preferably, the thickness ranges from 1 nm to 5 nm and most preferably 2 nm.

Figure 3:
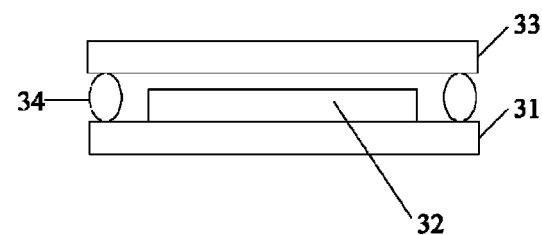
FIG. 3 is a schematic diagram showing a structure of a display apparatus according to an embodiment of the present invention.

The present invention further provides a display apparatus. Please refer to FIG. 3, FIG. 3 is a schematic diagram showing a structure of a display apparatus according to an embodiment of the present invention.

The display apparatus comprises a glass substrate 31, a diode 32, and a cover plate 33. The diode 32 is formed on the glass substrate 31. The diode 32 may be a diode described in any of the above-mentioned embodiments. The diode 32 is packaged with the cover plate 33 by a UV adhesive or a FRIT adhesive to form the display apparatus. The display apparatus sealed according to the embodiments of the present invention has a small bezel width and aesthetic appearance.

Parameters of each of the structural layers of the diode prepared according to one of the embodiments of the present invention are as follows:

the transparent anode layer 21 is made of indium tin oxide (ITO);

the first transparent metal layer 22 is made of Ag, and has a purity of 99.999 percent and a thickness of 10 nm;

the transparent metal oxide layer 12 is made of $WO_3$ having a HOMO value of 5.7 eV which is close to the HOMO value of the material used for making the hole inject layer (5.3 eV) and a HOMO value of the material used for making the hole transport layer (5.4 eV);

the basic stack layer 13 is constituted by the hole inject layer/the hole transport layer/ the light emitting layer/the electron transport layer/the electron inject layer (HIL/HTL/EML/ETL/EIL);

the second transparent metal layer I 23 is made of Mg: Ag, and has a thickness of 10 nm;

the second transparent metal layer II 24 is made of Ag, and has a thickness of 10 nm;

the non-transparent metal layer 25 is made of Al, and has a thickness of 80 nm;

the anti-reflective layer 26 is made of n-Propyl bromide (NPB), and has a thickness of 60 nm;

the thin film I 27 is made of Liq, and has a thickness of 40 nm;

the third transparent metal layer 28 is made of Al, and has a thickness of 2 nm;

the thin film II 29 is made of Liq, and has a thickness of 40 nm.

Based on the luminescence analysis of the above-mentioned diode from the surface of the substrate, both efficiency and brightness of the present invention diode are much more improved when compared with the diode having a conventional structure. The most well fabricated diode has an efficiency increased from 8 Cd/A to 13 Cd/A, and a brightness improved from 430 $Cd/m^2$ to 1260 $Cd/m^2$. Based on the luminescence analysis from the surface of the cover plate, owing to the adoption of the double-layered transparent cathode and the external-coupling light emitting layer, both efficiency and brightness of the present invention diode are also much more improved when compared with the diode having the conventional structure.

Figure 4:
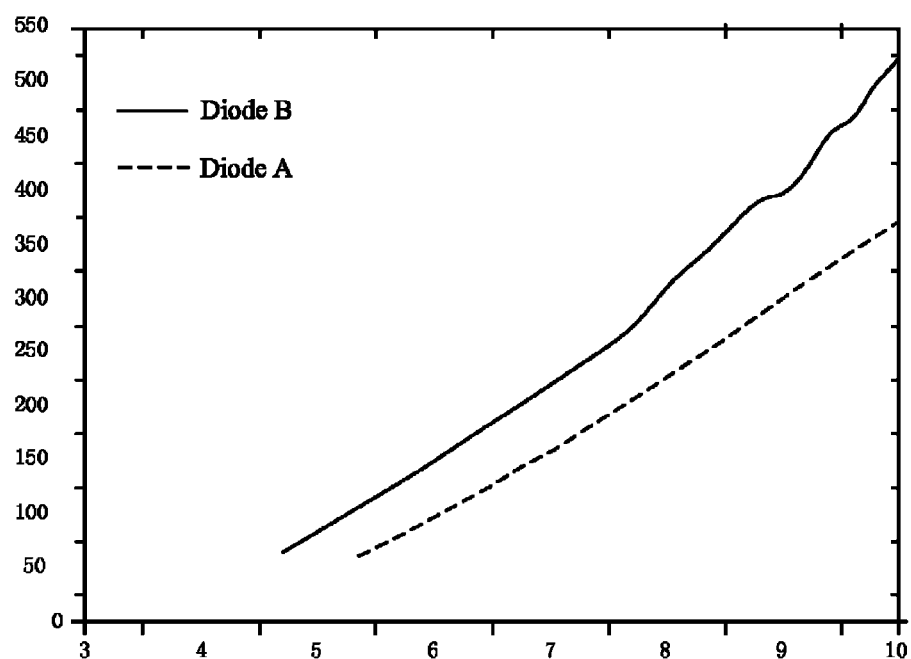
FIG. 4 is a schematic diagram showing a comparison of brightness between the present invention diode and a conventional diode.

Please refer to FIG. 4, FIG. 4 is a schematic diagram showing a comparison of brightness between a diode fabricated according to one of the embodiments of the present invention and a conventional diode. Diode A shown in the figure is the conventional diode, while diode B is the present invention diode. According to the comparison result shown in the figure, the present invention diode has an obviously improved brightness when compared with the conventional diode. The diode voltage of the present invention diode is also reduced.

Figure 5:
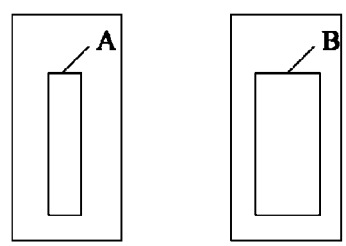
FIG. 5 is a schematic diagram showing comparison of pixel shrinkage between the present invention diode and a conventional diode.

According to the present invention, a packaging structure constituted by multi-layered films, namely the barrier layer as described in the above-mentioned embodiment, is used for blocking moisture and oxygen. Hence, a better effect is achieved. Please refer to FIG. 5, the present invention method which adopts the thin film packaging structure effectively resolves the problem of pixel shrinkage. In the figure A indicates the pixel shrinkage situation of the conventional diode, while B indicates the pixel shrinkage situation of the present invention diode in which a sandwich structure constituted by two thin films and the third transparent metal layer is used as the barrier layer. It is thus clear that the present invention diode effectively resolves the problem of pixel shrinkage and significantly decreases the non-emitting area. The bezel width of the display apparatus utilizing the present invention diode is thus smaller.

According to the illustration of the above-mentioned embodiments, it is understandable that the composite structure adopted by the present invention diode, which is the combination of the composite anode, the transparent metal oxide layer, and the composite cathode, will render a better energy level match among all structural layers in the diode. In addition, with the help of mirror effect and microcavity effect, both efficiency and brightness of the diode from the substrate surface are much more improved. The luminous performance and reliability of the diode are thus improved to elongate the lifetime of the diode. By controlling the work function of the material making the transparent metal oxide layer close to the HOMO value of the material used for making the hole inject layer of the diode, the diode voltage is reduced.

By disposing the anti-reflective layer on the cathode of the diode, the luminous performance of the diode from the surface of the cover plate is further improved.

In other respects, the barrier layer is used for replacing the conventional desiccant layer when the present invention diode is packaged into the display apparatus. Not only is the non-emitting area of the display apparatus decreased, but also the display apparatus has a narrow bezel and an aesthetic appearance.

Figure 6:
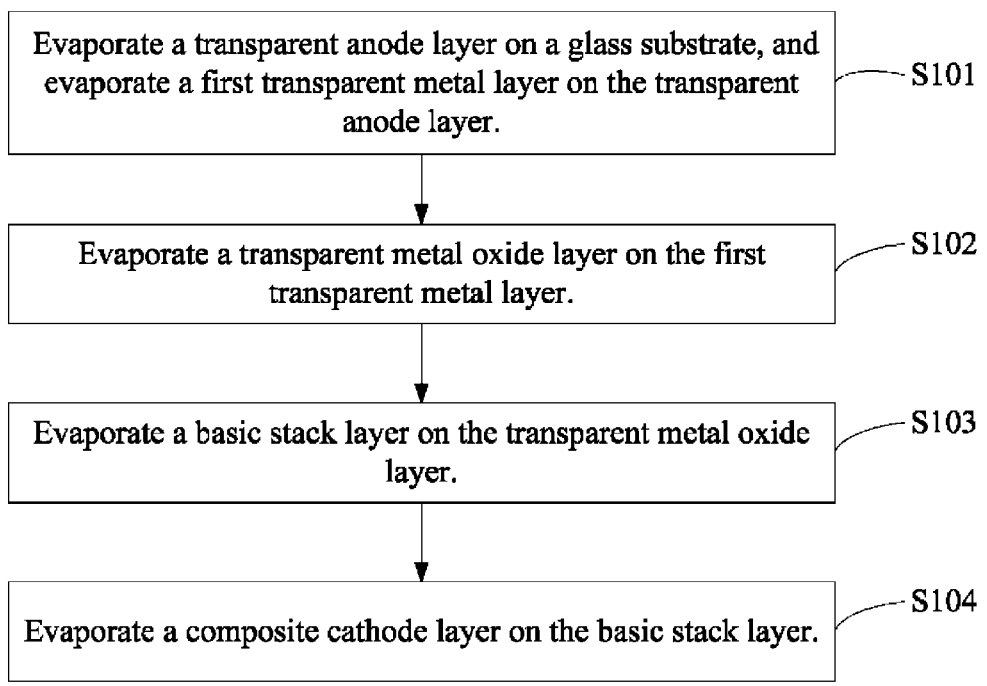
FIG. 6 is a flowchart of a method for manufacturing a diode according to an embodiment of the present invention.

The present invention further provides a method for manufacturing a diode. Please refer to FIG. 6, the present invention method for manufacturing the diode comprises the following steps:

Step 101: evaporate a transparent anode layer on a glass substrate, and evaporate a first transparent metal layer on the transparent anode layer;

The transparent ITO anode layer is evaporated on the glass substrate, and a thin high purity metal layer is evaporated on the conventional single-layered transparent ITO anode layer. For example, a Ag layer or a Au layer has a thickness of 5-10 nm and a purity of more than 99.999 percent. Light transmittance of the thin metal layer is more than 90 percent.

Step 102: evaporate a transparent metal oxide layer on the first transparent metal layer;

The thin transparent metal oxide layer is evaporated on the first transparent metal layer. A thickness of the transparent metal oxide layer is between 1 nm and 5 nm. A material with a work function close to a HOMO value of a material used for making the hole inject layer is selected to make the transparent metal oxide layer, for example, $WO_3$.

Step 103: evaporate a basic stack layer on the transparent metal oxide layer;

The basic stack layer is a major portion of the diode, and usually comprises a hole inject layer, a hole transport layer, a light emitting layer, an electron transport layer, and an electron inject layer. The hole inject layer, the hole transport layer, the light emitting layer, the electron transport layer, and the electron inject layer are sequentially formed on the transparent metal oxide layer.

Step 104: evaporate a composite cathode layer on the basic stack layer;

A thin transparent metal layer (Mg:Ag layer) is usually used as a transparent cathode of a conventional diode. According to an embodiment of the present invention, the composite cathode layer having a stack of a plurality of layers is adopted. The composite cathode layer may comprise two transparent metal layers. That means, the thin Mg:Ag layer is evaporated on the whole emitting area followed by evaporating a Ag layer. A thickness of each of the layers is between 5 nm and 15 nm to ensure good transmittance.

The composite cathode layer further comprises a non-transparent metal layer. The thicker non-transparent metal layer is evaporated on any edge or edges of the pixel. A thickness of the non-transparent metal layer is greater than 50 nm. For example, the thickness is between 50 nm and 250 nm. More preferably the thickness ranges from 60 nm to 90 nm and most preferably 80 nm. An area of the non-transparent metal layer is smaller than one fifth of the whole light-emitting area. Portions of the cathode having the non-transparent metal layer are non-transmissive, and such an area should be small to allow most portions of the cathode transparent to ensure the double-emitting effect. For example, an Al layer having a thickness of 80 nm is evaporated on the two transparent metal layers.

After forming the cathode, an anti-reflective layer, being an external-coupling light emitting layer, may be formed to further improve the luminous performance of the diode from the surface of the cover plate. The anti-reflective layer may be made of a low-cost organic material, such as a material used for making the hole transport layer or the electron transport layer. However, the selected material should not have a high absorption of visible light, and the material must be stable enough to avoid crystallization phenomenon. For example, n-Propyl bromide (NPB) can be selected to make the anti-reflective layer. A thickness of the anti-reflective layer is preferably kept between 10 nm and 80 nm. More preferably the thickness ranges from 50 nm to 70 nm and most preferably 60 nm.

In the ordinary course of manufacturing of a display apparatus, a desiccant is first applied to the non-emitting area of the diode and followed by sealing with an UV adhesive. Under the circumstances, the non-emitting area of the diode is enlarged so that the bezel width of the display apparatus is large to cause unaesthetic appearance.

In order to make the display apparatus having packaged diode more aesthetically, the present invention diode further comprises a barrier layer on the above-mentioned anti-reflective layer. The barrier layer is a film used for blocking moisture and oxygen. The barrier layer, being used for replacing the conventional desiccant layer, may be any thin film being able to block moisture and oxygen. In order to achieve a better barrier effect, a stack of a plurality of thin films may be used as the barrier layer. More preferably, a sandwich structure constituted by two thin films and a third transparent metal layer is used as the barrier layer.

A thin film material used for making the barrier layer may be a low-cost organic or inorganic material, for example: 8-hydroxyquionline lithium (Liq). A material of each of the thin films may be different from each other, or the same as each other. Thicknesses of the thin films are preferably kept between 10 nm and 60 nm. More preferably, the thicknesses range from 20 nm to 50 nm and most preferably 40 nm.

The third transparent metal layer may be made of a low-cost metal, for example: aluminum or copper. A thickness of the third transparent metal layer is preferably kept between 1 nm and 10 nm. More preferably, the thickness ranges from 1 nm to 5 nm and most preferably 2 nm.

According to the illustration of the above-mentioned embodiments, it is understandable that the composite structure adopted by the present invention diode, which is the combination of the composite anode, the transparent metal oxide layer, and the composite cathode, will render a better energy level match among all structural layers in the diode. In addition, with the help of mirror effect and microcavity effect, both efficiency and brightness of the diode from the substrate surface are much more improved. The luminous performance and reliability of the diode are thus improved to elongate the lifetime of the diode. By controlling the work function of the material making the transparent metal oxide layer close to the HOMO value of the material used for making the hole inject layer of the diode, the diode voltage is reduced.

By disposing the anti-reflective layer on the cathode of the diode, the luminous performance of the diode from the surface of the cover plate is further improved.

In other respects, the barrier layer is used for replacing the conventional desiccant layer when the present invention diode is packaged into the display apparatus. Not only is the non-emitting area of the display apparatus decreased, but also the display apparatus has a narrow bezel and an aesthetic appearance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a diode, comprising:
    evaporating a transparent anode layer on a glass substrate, evaporating a first transparent metal layer on the transparent anode layer, and the transparent anode layer and the first transparent metal layer constituting a composite anode;
    evaporating a transparent metal oxide layer on the first transparent metal layer;
    evaporating a basic stack layer on the transparent metal oxide layer; and
    evaporating two second transparent metal layers on the basic stack layer sequentially; and
    evaporating a non-transparent metal layer on at least one edge of the second transparent metal layer, and an area of the non-transparent metal layer being smaller than one fifth of an area of the second transparent metal layer, after evaporating those two second transparent metal layers on the basic stack layer sequentially.

2. The method as claimed in claim 1, wherein the method further comprises the step after evaporating the non-transparent metal layer on the at least one edge of the second transparent metal layer:
    evaporating an anti-reflective layer on the non-transparent metal layer.

3. The method as claimed in claim 2, wherein the method further comprises the step after evaporating the anti-reflective layer on the non-transparent metal layer:
    forming a barrier layer to cover the anti-reflective layer, and the barrier layer being a film used for blocking moisture and oxygen.

* * * * *